(12) United States Patent
Abe et al.

(10) Patent No.: US 7,075,114 B2
(45) Date of Patent: Jul. 11, 2006

(54) LIGHT-EMITTING DIODE FOR LARGE CURRENT DRIVING

(75) Inventors: Tomoaki Abe, Tokyo (JP); Kaori Namioka, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 183 days.

(21) Appl. No.: 10/659,062

(22) Filed: Sep. 10, 2003

(65) Prior Publication Data

US 2004/0227145 A1 Nov. 18, 2004

(30) Foreign Application Priority Data

May 16, 2003 (JP) .............................. 2003-138307

(51) Int. Cl.
*H01L 23/36* (2006.01)
(52) U.S. Cl. ........................... 257/98; 257/99; 257/100
(58) Field of Classification Search .......... 257/98–100, 257/79; 362/84, 800; 438/22, 26, 27; 313/498, 313/512
See application file for complete search history.

(56) References Cited

U.S. PATENT DOCUMENTS

| | | | |
|---|---|---|---|
| 6,274,924 B1 * | 8/2001 | Carey et al. ................. | 257/676 |
| 6,335,548 B1 * | 1/2002 | Roberts et al. ............... | 257/98 |
| 6,392,294 B1 * | 5/2002 | Yamaguchi .................. | 257/690 |
| 6,516,104 B1 * | 2/2003 | Furuyama ..................... | 385/14 |
| 2001/0050371 A1 * | 12/2001 | Odaki et al. .................. | 257/98 |
| 2002/0042156 A1 * | 4/2002 | Chen ............................ | 438/26 |
| 2002/0113244 A1 * | 8/2002 | Barnett et al. ................ | 257/98 |
| 2002/0190637 A1 * | 12/2002 | Matsubara et al. ......... | 313/503 |
| 2005/0072981 A1 * | 4/2005 | Suenaga ....................... | 257/88 |

FOREIGN PATENT DOCUMENTS

GB 2361581 A * 10/2001

* cited by examiner

*Primary Examiner*—Ashok Patel
*Assistant Examiner*—Christopher M. Raabe
(74) *Attorney, Agent, or Firm*—Weingarten, Schurgin, Gagnebin & Lebovici LLP

(57) ABSTRACT

A light-emitting diode for large current driving (1) is provided according to the invention. It comprises a metal substrate (4) having an upper surface and provided with an electrically insulated distribution circuit (4a) formed on the upper surface. A metal base (3) is directly attached to the metal substrate (4) and provided with an LED chip (2) mounted thereon. A gold wire (5) is arranged to connect the distribution circuit to the LED chip. A resin lens (6) is arranged to cover part of the metal base over the LED chip including at least the gold wire (5). Therefore, the metal base with the LED chip mounted thereon and the metal substrate can contact the atmosphere in a large area to dissipate heat efficiently. While keeping this construction, the LED chip can be wired with a small amount of heat through the distribution circuit separated from the metal substrate.

19 Claims, 2 Drawing Sheets

LIGHT-EMITTING DIODE FOR LARGE CURRENT DRIVING

BACKGROUND OF THE INVENTION

1. Field of the Invention

The present invention relates to a light-emitting diode also named LED lamp, and more particularly to a construction that houses the diode in a casing with improved thermal radiation efficiency suitable for driving it with a larger current to emit a large amount of light. In an exemplary application to a light source for a lamp that requires a relatively high brightness, such as a traffic signal, it can be achieved with a smaller number of LED lamps.

2. Description of the Related Art

To achieve a large amount of light output per light-emitting diode, a conventional construction intends to improve the efficiency of cooling an LED chip and drive it with a higher power. In such the construction, a thicker metal plate is applied to form part of a lead-frame that is employed to die-mount the LED chip thereon. In addition, one surface of the metal plate is exposed to external to dissipate the heat radiated from the LED chip directly to the atmosphere to achieve efficient cooling (for example, see Patent Document 1: Japanese Patent Application Laid-Open No. 2003-60240, paragraphs 0014–0027, FIGS. 1 and 5).

In the above-described conventional construction of the light-emitting diode lamp, the metal plate for use in formation of the lead-frame can exactly dissipate the heat radiated from the LED chip efficiently to external. The metal plate, however, transmits the external heat to the LED chip at the same efficiency.

In the conventional construction of the light-emitting diode lamp, the metal plate also has a function of terminal for supplying power to the LED chip. Accordingly, when the metal plate is connected to a power source by means of soldering, for example, the process heat is transmitted directly to the LED chip and heats the LED chip more than required, badly influencing on the lifetime of the LED chip possibly. This is a subject to be solved.

SUMMARY OF THE INVENTION

As a specific means for solving the above conventional subject, the present invention provides a light-emitting diode for driving by large current, which comprises a metal substrate provided with a distribution circuit formed on the surface thereof and electrically insulated therefrom; a metal base directly attached to and thereby in thermally contact with said metal substrate and provided with an LED chip mounted thereon; a gold wire connecting said distribution circuit with said LED chip; and a plastic lens attached over a surface of the metal substrate on which a surface said LED chip is mounted. The plastic lens covers part of said metal base including at least said gold wire.

A first through hole is formed in the metal substrate at least at one spot of which a location is corresponding to that of the plastic lens and the plastic lens is attached through the first through hole The metal base is attached to the metal substrate by means of caulking or press fitting.

The metal base is composed of copper and the metal substrate is composed of copper or aluminum.

A space is formed on a rear of the plastic lens and between the plastic lens and the metal substrate to contain the LED chip, the gold wire and part of the metal base, and is filled with a silicone resin.

At least one through hole is formed at a location in the metal substrate which a location corresponds to that of the space thus formed, and the silicone fills the space through the through hole.

BRIEF DESCRIPTION OF THE DRAWINGS

The present invention will be more fully understood from the following detailed description with reference to the accompanying drawings, in which.

DETAILED DESCRIPTION OF THE PREFERRED EMBODIMENTS

Figure 1:
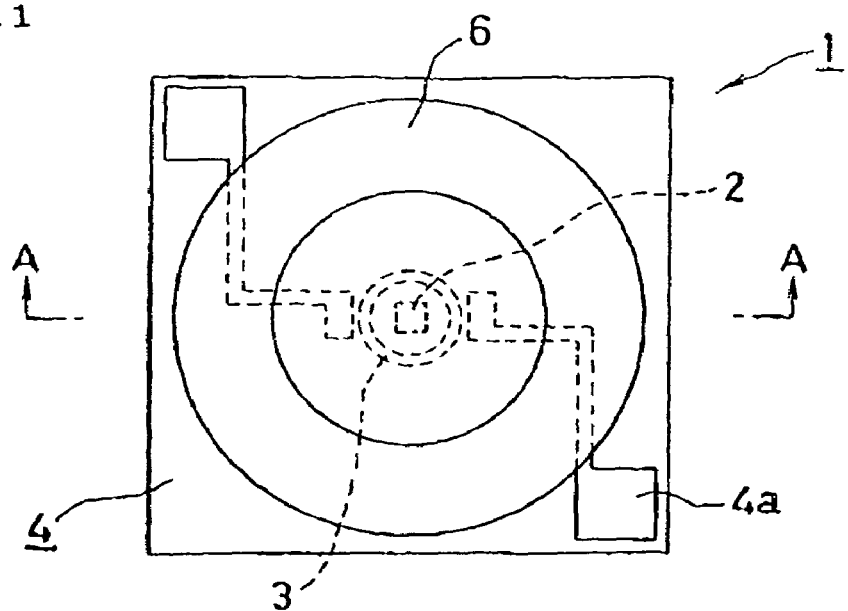
FIG. 1 is a plan view showing an embodiment of the light-emitting diode for large current driving according to the present invention.
Figure 2:
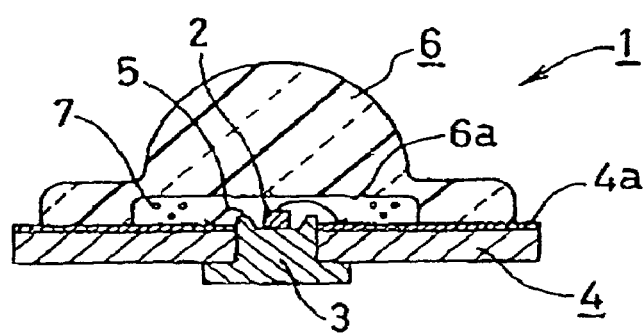
FIG. 2 is a cross-sectional view taken along the A—A line in FIG. 1.

The present invention will be described next with reference to the drawings. In FIGS. 1 and 2, the reference numeral 1 denotes a light-emitting diode for large current driving according to the present invention (hereinafter simply referred to as the "light-emitting diode 1"). The light-emitting diode 1 comprises an LED chip 2, a metal base 3, a metal substrate 4, gold wires 5, a resin lens 6 and a silicone resin 7.

The LED chip 2 may have a conventional size of 0.4 mm square, for example. For the purpose of the present invention to increase the amount of light per light-emitting diode, it may be preferably upsized, for example, to 0.8 mm square to flow a sufficient driving current therethrough.

The metal base 3 is provided for die bonding the LED chip 2 thereon. In consideration of the die bonding by soldering, the metal base is composed of a material so selected as to have an excellence in adhesion and wetness as well as a nice thermal conductivity, such as copper.

The metal base 3 with the LED chip 2 bonded thereon is attached to the metal substrate 4 and secured by means of caulking or press fitting to enlarge the thermal radiation area effective for the heat produced by the LED chip 2. Therefore, as for the metal substrate 4 that is not bonded directly to the LED chip 2, the soldering performance is not considered necessarily but rather the thermal radiation performance may be considered mainly. The metal substrate has a larger volume compared to the metal base 3. Therefore, it is preferable to consider the cost and specifically the use of aluminum accordingly, for example.

Figure 3:
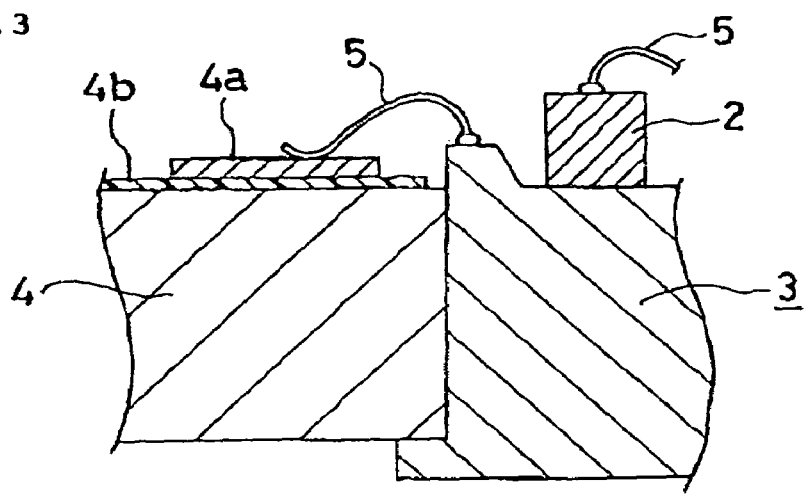
FIG. 3 is an enlarged cross-sectional view showing the major part of the same embodiment.

In the present invention, the metal substrate 4 is additionally provided with a distribution circuit 4a for wiring to the LED chip 2 die-mounted on the metal base 3. The distribution circuit 4a is composed of a conductive material such as a copper foil as shown in FIG. 3 and attached to the metal substrate 4 via a thin film 4b composed of an insulating material such as an epoxy resin. Thus, the distribution circuit 4a is electrically insulated from the metal substrate 4.

The distribution circuit 4a is employed for wiring to supply power to the LED chip 2 and accordingly provided on a surface of the metal substrate 4 at the same side of the LED chip 2 die-mounted on the metal base 3, or the upper surface. The gold wire 5 is applied for wire bonding between the distribution circuit 4a and the LED chip 2 and between the distribution circuit 4a and the metal base 3 to connect them electrically.

Over the assembly of the LED chip 2, metal base 3 and metal substrate 4, the resin lens 6 is attached to cover the LED chip 2 to protect the LED chip 2 and the gold wires 5. A recess 6a is formed in the rear of the resin lens 6 to prevent the LED chip 2 and the gold wires 5 from interfering such as contacting or impacting with the resin lens 6.

Figure 4:
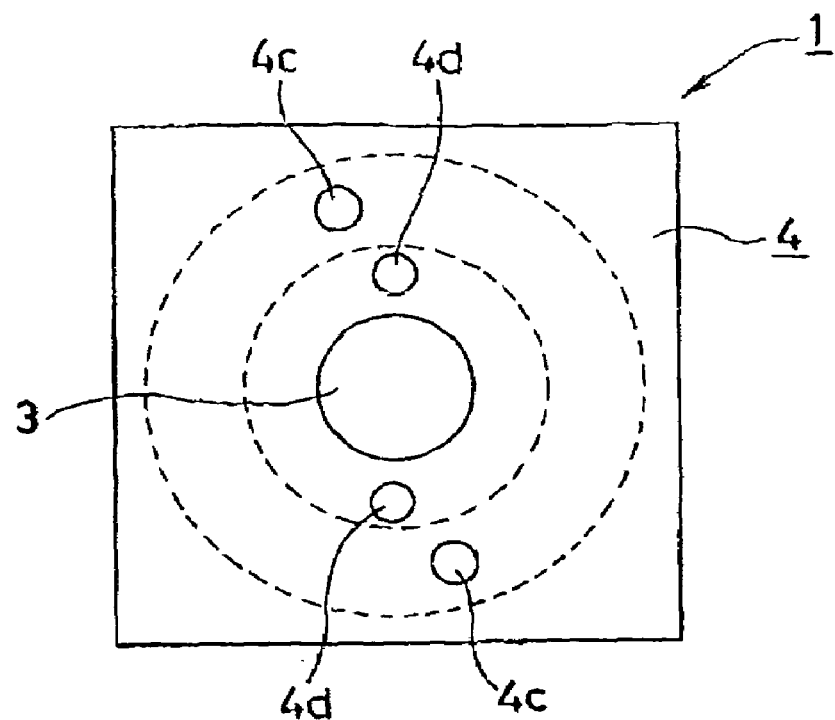
FIG. 4 is a rear view of the same embodiment.

The resin lens 6 is provided with bosses and the metal substrate 4 is provided with lens attachment holes 4c as shown in FIG. 4. The bosses are inserted into the corresponding lens attachment holes 4c for attachment by appropriate means of adhesive or caulking. In this construction, the recess 6a forms a space between the metal substrate 4 and the resin lens 6 to house the LED chip 2 and the gold wires 5 therein.

In the present invention, the silicone resin 7 is injected into the space to prevent the gold wires from resonating and being broken by vibrations as well as the LED chip 2 from falling off by impacts. Silicone injection holes 4d are formed in the metal substrate 4 at locations corresponding to the space or the recess 6a in the resin lens 6.

The silicone resin 7 is a high-viscosity liquid before it is heated and cured. Accordingly, it is preferable to provide an air escape in order to inject the silicone resin efficiently. For the purpose, in the present invention, the silicone injection holes 4d are provided two for use in the injection and in the air escape. The silicone resin 7 is heated and cured after injected. Thus, the silicone resin 7 does not leak through the silicone injection holes 4d.

The light-emitting diode 1 of the present invention thus constructed has the following effect and operation, which are described next. According to the present invention, the LED chip 2 is directly die-mounted, for example, soldered on the metal base 3 that is composed of a metallic material with a nice thermal conductivity, such as copper. As a result, the heat radiated from the LED chip 2 while it is turned on can be efficiently transferred to the metal base 3.

The metal base 3 is integrated with the metal substrate 4 by means of caulking or press fitting excellent in intimate contact. Therefore, the heat produced at the LED chip 2 and transferred to the metal base 3 is further transferred to the metal substrate 4 that contacts the atmosphere in a wider area, and dissipated to the atmosphere. This is effective to cool the LED chip 2 efficiently.

In general, materials that are easy for soldering and excellent in thermal conductivity include those that are almost expensive, for example, copper. In contrast, materials that are excellent in thermal conductivity but difficult for soldering include those that are almost inexpensive, for example, aluminum. The construction of the present invention is divided into the metal substrate 4 and the metal base 3 to achieve a large area inexpensively.

Figure 5:
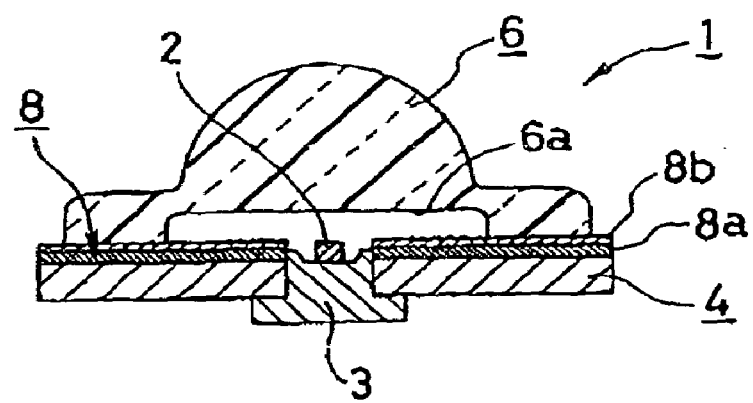
FIG. 5 is a plan view showing another embodiment of the light-emitting diode for large current driving according to the present invention.

FIG. 5 shows another embodiment of the light-emitting diode 1 according to the present invention. In the previous embodiment, the distribution circuit 4a comprises a copper foil directly adhered on the metal substrate 4 using an epoxy resin adhesive. Thus, the distribution circuit 4a can be insulated from the metal substrate 4 by the insulation of the epoxy resin interposed therebetween.

In the above construction, however, if the metal foil has fins caused by failures in processes, for example, they penetrate the epoxy resin at the time of adhesion. As a result, the metal substrate 4 and the distribution circuit 4a make a short circuit therebetween, reducing the yield of the light-emitting diode 1 with a high possibility.

When the metal substrate 4 at the side of the distribution circuit 4a in the previous embodiment is studied with respect to a degree involved in thermal radiation, it is found that this side can not be expected much to radiate heat directly to the atmosphere because it is covered in the resin lens 6.

In the present embodiment, as shown in FIG. 5, a circuit substrate 8 includes an insulation substrate 8a named printed circuit board and the like and a distribution circuit 8b composed of a copper foil adhered on the insulation substrate 8a. This substrate 8 is attached on the side of the metal substrate 4 where the resin lens 6 is attached. Also in this embodiment, the lens attachment holes and the silicone injection holes are provided, if required, though they are omitted to depict. If provided, they penetrate the metal substrate 4 and the substrate 8.

In accordance with the present invention, a light-emitting diode for large current driving is provided as described above. It comprises a metal substrate having an upper surface and provided with an electrically insulated distribution circuit formed on the upper surface; a metal base directly attached to the metal substrate and provided with an LED chip mounted thereon; a gold wire arranged to connect the distribution circuit to the LED chip; and a resin lens arranged to cover part of the metal base over the LED chip including at least the gold wire. Therefore, the metal base with the LED chip mounted thereon and the metal substrate can contact the atmosphere in a large area to dissipate heat efficiently. While keeping this construction, the LED chip can be wired with a small amount of heat through the distribution circuit separated from the metal substrate. Thus, an extremely excellent effect can be expected to prevent the wiring from deteriorating and improve the reliability of the light-emitting diode of this type.

Having described the embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. A light-emitting diode for large current driving, comprising:
   a metal substrate provided with a distribution circuit formed on the surface thereof and electrically insulated therefrom;
   a through opening in the metal substrate;
   a metal base having a portion position in the through opening and being directly attached to and thereby in thermally contact with said metal substrate, and provided with an LED chip mounted thereon;
   a gold wire connecting said distribution circuit with said LED chip; and
   a plastic lens attached over a surface of said metal substrate on which a surface said LED chip is mounted, said lens covering part of said metal base including at least said gold wire.

2. The light-emitting diode for large current driving according to claim 1, wherein a first through hole is formed in said metal substrate at least at one spot of which a location is corresponding to that of said plastic lens and said plastic lens is attached through said first through hole.

3. The light-emitting diode for large current driving according to claim 2, wherein said metal base is attached to said metal substrate by means of caulking or press fitting.

4. The light-emitting diode for large current driving according to claim 2, wherein said metal base is composed of copper.

5. The light-emitting diode for large current driving according to claim 2, wherein said metal substrate is composed of copper or aluminum.

6. The light-emitting diode for large current driving according to claim 2, wherein a space is formed on a rear of said plastic lens and between said plastic lens and said metal substrate to contain said LED chip, said gold wire and part of said metal base, and is filled with a silicone resin.

7. The light-emitting diode for large current driving according to claim 2, wherein:
   said metal base is attached to said metal substrate by means of caulking or press fitting;
   said metal base is composed of copper;
   said metal substrate is composed of copper or aluminum;
   a space is formed on a rear of said plastic lens and between said plastic lens and said metal substrate to contain said LED chip, said gold wire and part of said metal base, and is filled with a silicone resin.

8. The light-emitting diode for large current driving according to claim 7, wherein at least one through hole is formed at a location in said metal substrate which a location corresponds to that of said space, and said silicone fills said space through said through hole.

9. The light-emitting diode for large current driving according to claim 1, wherein said metal base is attached to said metal substrate by means of caulking or press fitting.

10. The light-emitting diode for large current driving according to claim 9, wherein said metal base is composed of copper.

11. The light-emitting diode for large current driving according to claim 9, wherein said metal substrate is composed of copper or aluminum.

12. The light-emitting diode for large current driving according to claim 9, wherein a space is formed on a rear of said plastic lens and between said plastic lens and said metal substrate to contain said LED chip, said gold wire and part of said metal base, and is filled with a silicone resin.

13. The light-emitting diode for large current driving according to claim 1, wherein said metal base is composed of copper.

14. The light-emitting diode for large current driving according to claim 13, wherein said metal substrate is composed of copper or aluminum.

15. The light-emitting diode for large current driving according to claim 13, wherein a space is formed on a rear of said plastic lens and between said plastic lens and said metal substrate to contain said LED chip, said gold wire and part of said metal base, and is filled with a silicone resin.

16. The light-emitting diode for large current driving according to claim 1, wherein said metal substrate is composed of copper or aluminum.

17. The light-emitting diode for large current driving according to claim 16, wherein a space is formed on a rear of said plastic lens and between said plastic lens and said metal substrate to contain said LED chip, said gold wire and part of said metal base, and is filled with a silicone resin.

18. The light-emitting diode for large current driving according to claim 1, wherein a space is formed on a rear of said plastic lens and between said plastic lens and said metal substrate to contain said LED chip, said gold wire and part of said metal base, and is filled with a silicone resin.

19. The light-emitting diode for large current driving according to claim 18, wherein at least one through hole is formed at a location in said metal substrate which a location corresponds to that of said space, and said silicone fills said space through said through hole.

* * * * *